(12) United States Patent
Okada et al.

(10) Patent No.: US 10,539,607 B2
(45) Date of Patent: Jan. 21, 2020

(54) EVALUATION APPARATUS INCLUDING A PLURALITY OF INSULATING PORTIONS SURROUNDING A PROBE AND SEMICONDUCTOR DEVICE EVALUATION METHOD BASED THEREON

(71) Applicant: Mitsubishi Electric Corporation, Tokyo (JP)

(72) Inventors: Akira Okada, Tokyo (JP); Kinya Yamashita, Tokyo (JP); Masaki Ueno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 159 days.

(21) Appl. No.: 15/588,783

(22) Filed: May 8, 2017

(65) Prior Publication Data
US 2018/0088170 A1    Mar. 29, 2018

(30) Foreign Application Priority Data
Sep. 28, 2016    (JP) .................................. 2016-189189

(51) Int. Cl.
G01R 31/00    (2006.01)
G01R 31/26    (2014.01)
(Continued)

(52) U.S. Cl.
CPC ........ G01R 31/261 (2013.01); H01L 21/6838 (2013.01); H01L 21/68714 (2013.01)

(58) Field of Classification Search
CPC ............ G01R 31/2601; G01R 31/2808; G01R 31/2862; G01R 31/2879; G01R 1/067; G01R 1/18
See application file for complete search history.

(56) References Cited

U.S. PATENT DOCUMENTS

2012/0299613 A1    11/2012    Kaguchi et al.
2013/0106453 A1*   5/2013    Ikegami ............. G01R 1/07314
                                                        324/750.19
(Continued)

FOREIGN PATENT DOCUMENTS

CN    102798738 A    11/2012
CN    103091515 A    5/2013
(Continued)

OTHER PUBLICATIONS

An Office Action mailed by the State Intellectual Property Office of the People's Republic of China dated Aug. 5, 2019, which corresponds to Chinese Patent Application No. 201710899457.4 and is related to U.S. Appl. No. 15/588,783; with English translation.
(Continued)

Primary Examiner — Minh N Tang
(74) Attorney, Agent, or Firm — Studebaker & Brackett PC (57) ABSTRACT

An evaluation apparatus includes an insulating plate, a plurality of probes fixed to the insulating plate, an insulating portion having a connection portion connected to the insulating plate in a detachable manner and a tip portion continuous with the connection portion, the tip portion being narrower than the connection portion, an insulator formed by combining the insulating portions to surround the plurality of probes in planar view, and an evaluation unit for passing currents through the plurality of probes to evaluate electrical characteristics of an object to be measured.

18 Claims, 7 Drawing Sheets

(51) Int. Cl.
    *H01L 21/683* (2006.01)
    *H01L 21/687* (2006.01)

(56) References Cited

U.S. PATENT DOCUMENTS

| | | |
|---|---|---|
| 2015/0015285 A1 | 1/2015 | Shinohara et al. |
| 2015/0115989 A1* | 4/2015 | Okada ................ G01R 31/2808 |
| | | 324/754.03 |

FOREIGN PATENT DOCUMENTS

| | | |
|---|---|---|
| CN | 104597384 A | 5/2015 |
| JP | S63-217634 A | 9/1988 |
| JP | 2001-051011 A | 2/2001 |
| JP | 2003-130889 A | 5/2003 |
| JP | 2010-010306 A | 1/2010 |
| JP | 2012-247196 A | 12/2012 |
| JP | 2013-096837 A | 5/2013 |
| JP | 2015-035577 A | 2/2015 |
| JP | 2015-087269 A | 5/2015 |

OTHER PUBLICATIONS

An Office Action mailed by the Japanese Patent Office dated Aug. 20, 2019, which corresponds to Japanese Patent Application No. 2016-189189 and is related to U.S. Appl. No. 15/588,783.

* cited by examiner

FIG.13 ical characteristics of, for example, a semiconductor wafer or a chip obtained by singulating a semiconductor wafer, and a semiconductor device evaluation method using the evaluation apparatus.

Background Art

EVALUATION APPARATUS INCLUDING A PLURALITY OF INSULATING PORTIONS SURROUNDING A PROBE AND SEMICONDUCTOR DEVICE EVALUATION METHOD BASED THEREON

BACKGROUND OF THE INVENTION

Field of the Invention

The present invention relates to an evaluation apparatus used to evaluate electrical characteristics of, for example, a semiconductor wafer or a chip obtained by singulating a semiconductor wafer, and a semiconductor device evaluation method using the evaluation apparatus.

Background Art

In an evaluation of electrical characteristics of a semiconductor device such as a wafer or a chip, a lower surface of the semiconductor device is fixed to the surface of a chuck stage in contact therewith by vacuum suction or the like, and then a probe is brought into contact with an electrode provided on part of an upper surface of the semiconductor device to input and output electrical signals. In an inspection of a semiconductor device having a vertical structure in which a large current is passed in a vertical direction of the semiconductor device, the surface of the chuck stage serves as an electrode. A large number of pins are used as probes, thus satisfying needs for application of large currents and high voltages.

In an evaluation of a vertically-structured semiconductor device in a chip state, a phenomenon called a partial discharge may occur between, for example, an electrode on an upper surface of the semiconductor device and a region having the same electric potential as a chuck stage and damage the semiconductor device. Reducing such partial discharges is important. If the occurrence of a partial discharge is failed to be detected, and a semiconductor device in which a partial discharge has occurred directly enters a downstream process as a good-quality product, the fact that a partial discharge has occurred is very difficult to extract in the downstream process. Accordingly, taking a measure to reduce partial discharges is desired.

Japanese laid-open patent publication Nos. 2003-130889, 2001-511111, and 2010-10306 disclose techniques for reducing partial discharges.

Japanese laid-open patent publication No. 2003-130889 discloses preventing an electrical discharge by evaluating a semiconductor device in an insulating liquid. However, realizing such a method requires an expensive evaluation apparatus. Further, there has been a problem that evaluation in a liquid increases evaluating time and is not suitable for cost reduction. Moreover, in the case where an object to be measured is a semiconductor element in a wafer test or a chip test, the insulating liquid also needs to be completely removed from the object to be measured after evaluation. Thus, such a technique is difficult to apply.

Japanese laid-open patent publication No. 2001-51011 discloses preventing an electrical discharge by performing an inspection with silicone rubber pressed against a termination portion of a semiconductor chip. However, in the technique of Japanese laid-open patent publication No. 2001-51011, since the silicone rubber is pressed against the entire surface of the termination portion, there has been a problem that a foreign substance stuck during evaluation or a rubber mark made by the silicone rubber is transferred to the surface of the semiconductor chip to cause a failure in a downstream process.

Japanese laid-open patent publication No. 2010-10306 discloses preventing an electrical discharge by pressing an insulating member against a wafer as an object to be measured as in Japanese laid-open patent publication No. 2001-51011. As described above, there has been a problem that a foreign substance stuck during evaluation or a rubber mark is transferred to the surface of the wafer to cause a failure in a downstream process.

SUMMARY OF THE INVENTION

The present invention has been made to solve problems such as described above, and an object of the present invention is to provide a convenient evaluation apparatus and a semiconductor device evaluation method which can reduce partial discharges and reduce foreign substances or rubber marks transferred to the surface of a semiconductor device during the evaluation of electrical characteristics of the semiconductor device.

The features and advantages of the present invention may be summarized as follows.

According to one aspect of the present invention, an evaluation apparatus includes an insulating plate, a plurality of probes fixed to the insulating plate, an insulating portion having a connection portion connected to the insulating plate in a detachable manner and a tip portion continuous with the connection portion, the tip portion being narrower than the connection portion, an insulator formed by combining the insulating portions to surround the plurality of probes in planar view, and an evaluation unit for passing currents through the plurality of probes to evaluate electrical characteristics of an object to be measured.

According to another aspect of the present invention, a semiconductor device evaluation method for evaluating electrical characteristics of a semiconductor device includes bringing a plurality of probes fixed to an insulating plate into contact with an active area of the semiconductor device, bringing an insulator connected to the insulating plate in a detachable manner to surround the plurality of probes into contact with part of a termination region surrounding the active area of the semiconductor device directly or with a protective member interposed therebetween, and passing currents through the plurality of probes.

Other and further objects, features and advantages of the invention will appear more fully from the following description.

BRIEF DESCRIPTION OF THE DRAWINGS

FIG. 6 is a bottom view showing an insulator and the like.

DETAILED DESCRIPTION OF THE PREFERRED EMBODIMENTS

Evaluation apparatuses and semiconductor device evaluation methods according to embodiments of the present invention will be described with reference to the drawings. The same or corresponding components will be denoted by the same reference signs, and the repetition of explanation thereof may be omitted.

Embodiment 1

Figure 1:
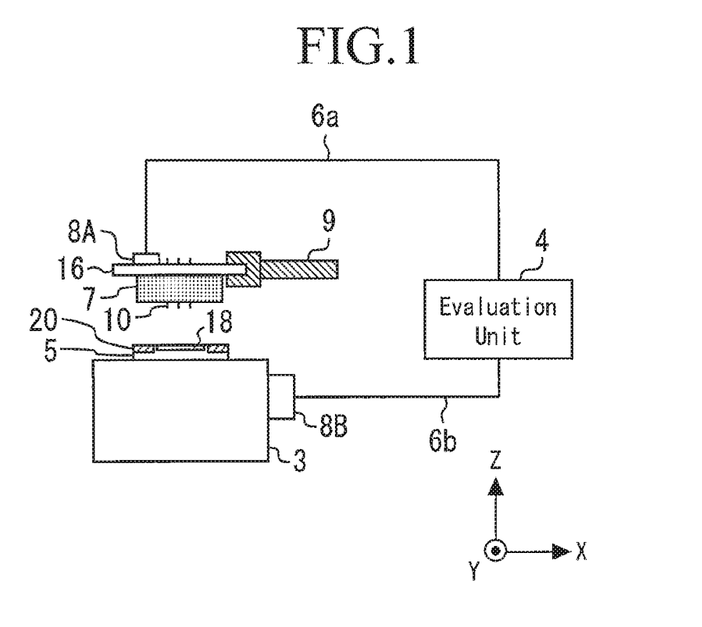
FIG. 1 is a schematic configuration diagram of an evaluation apparatus according to Embodiment 1.

FIG. 1 is a schematic configuration diagram of an evaluation apparatus according to Embodiment 1. A chuck stage 3 is a seat to which a semiconductor device 5 is fixed by vacuum suction. Means for holding the semiconductor device 5 is not limited to vacuum suction and may be electrostatic adsorption or the like. FIG. 1 shows one semiconductor device 5, but a plurality of semiconductor devices may be mounted on the chuck stage 3. The surface of the chuck stage 3 is electrically connected to an evaluation unit 4 through a connection unit 8B provided on a side surface of the chuck stage and a signal line 6b attached to the connection unit 8B.

The semiconductor device 5 has a vertical structure in which a large current is passed in a vertical direction of the semiconductor device 5, i.e., an out-of-plane direction. The semiconductor device 5 has an electrode pad 18 formed on an upper surface thereof, and also has an electrode formed on a lower surface thereof. A central portion of the semiconductor device 5 is an active area, and a region outside the central portion is a termination region 20.

Figure 2:
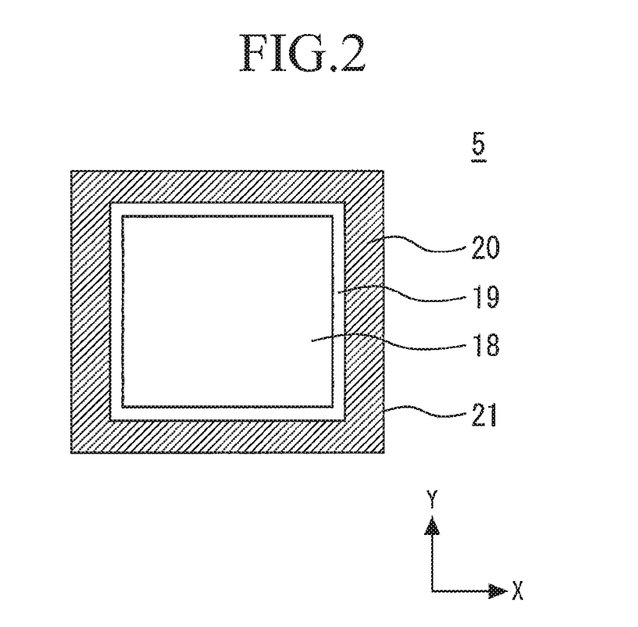
FIG. 2 is a plan view of the semiconductor device.

FIG. 2 is a plan view of the semiconductor device 5. The semiconductor device 5 is not particularly limited and is, for example, a vertical IGBT. The semiconductor device 5 includes the termination region 20 and the active area 19. The termination region 20 is provided in a peripheral portion of the semiconductor device 5 to ensure a sufficient withstand voltage of the semiconductor device 5. The active area 19 is a region surrounded by the termination region 20. The active area 19 is a region where a desired element, i.e., a vertical IGBT in this embodiment, is formed. The active area 19 has the electrode pad 18 provided on the surface thereof so that electrical signals can be inputted and outputted from/to the outside. The electrode pad 18 is made of a conductive material such as aluminum. In the case of a vertical IGBT, an emitter electrode and a gate electrode are formed on the upper surface of the semiconductor device 5, and a collector electrode is provided on the lower surface thereof. However, the arrangement and number of electrodes are not limited to this.

Referring back to FIG. 1, an insulating plate 16 is provided above the chuck stage 3. A plurality of probes 10 are fixed to the insulating plate 16 through sockets. The probes 10 are provided on the lower-surface side of the insulating plate 16. A connection unit 8A electrically connected to the probes 10 is provided on an upper surface of the insulating plate 16. The connection unit 8A and the probes 10 are connected with, for example, interconnects such as metal sheets provided on the upper surface of the insulating plate 16. The probes 10 are electrically connected to the evaluation unit 4 through the connection unit 8A and the signal line 6a. The reason why a plurality of probes 10 are provided is that a large current of, for example, 5 A or more is assumed to be applied. To make current densities applied to the respective probes 10 approximately equal, the connection units 8A and 8B are preferably provided at such positions that the distances from the connection unit 8A to the connection unit 8B provided on the side surface of the chuck stage 3 through the respective probes 10 are approximately equal. In other words, it is desirable that the connection unit 8A and the connection unit 8B face each other across the probes 10.

The insulating plate 16 can be moved in any direction with an arm 9. Thus, the probes 10 fixed to the insulating plate 16 can be brought into contact with the electrode pad 18 of the semiconductor device 5 mounted on the chuck stage 3. In the configuration described here, the insulating plate 16 is held by one arm 9. However, the insulating plate 16 may be more stably held by a plurality of arms. Moreover, instead of moving the insulating plate 16 with the arm 9, the semiconductor device 5, i.e., the chuck stage 3, may be moved.

Figure 3A:
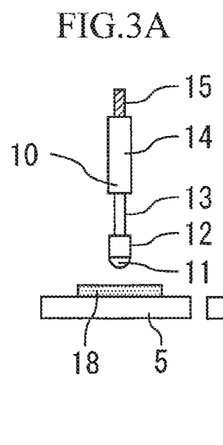
FIG. 3A is a view showing the probe.
Figures 3B, 3C:
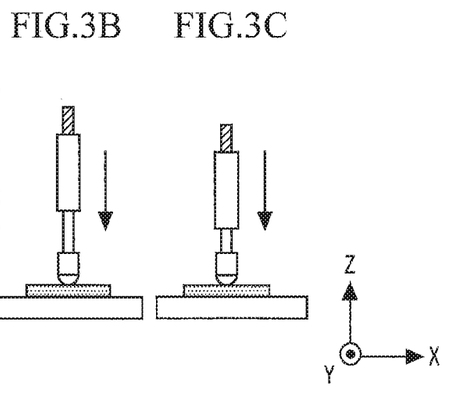
FIG. 3B is a view showing the movement of the probe.
FIG. 3C is a view showing a state in which the push-in portion is contracted.

FIG. 3 is a view showing the movement of the probe 10. The probe 10 includes a base installation portion 14 formed as a base and connected to the insulating plate 16 or to a socket provided on the insulating plate 16, a tip portion 12 having a contact portion 11 which comes in mechanical and electrical contact with the electrode pad 18 provided on the surface of the semiconductor device 5, a push-in portion 13 which can be extended and contracted in the z direction by a spring member such as a spring incorporated in the base installation portion 14, and an electrically connecting portion 15 electrically communicating with the tip portion 12 to serve as an output terminal to the outside. The probe 10 is made of a conductive material. The probe 10 is made of, for example, a metallic material such as copper, tungsten, or rhenium-tungsten alloy but is not limited to these. The contact portion 11 may be coated with, for example, gold, palladium, tantalum, platinum, or the like from the viewpoints of conductivity improvement, durability improvement, and the like.

When the probe 10 is lowered toward the electrode pad 18 in the negative z direction from an initial state denoted in FIG. 3A, the electrode pad 18 and the contact portion 11 come in contact with each other first. FIG. 3B shows a state in which the electrode pad 18 and the contact portion 11 have been brought into contact with each other. After that, when the probe 10 is further lowered, the push-in portion 13 is pushed in the base installation portion 14 through the spring member to make the contact between the contact portion 11 and the electrode pad 18 more reliable. A state in which the push-in portion 13 is contracted is shown at FIG. 3C.

The spring member provided in the base installation portion 14 to extend and contract the push-in portion 13 in the z direction may be provided outside. Instead of the probe 10, other probe which can extend and contract along the z axis may be employed such as a stacked probe or a wire probe. Moreover, the probe 10 is not limited to a spring type such as described above, and a cantilever contact probe may be employed.

Referring back to FIG. 1, an insulator 7 is fixed to the lower surface of the insulating plate 16. The insulator 7 is attached to the insulating plate 16 to surround the active area 19 of the semiconductor device 5 during semiconductor device evaluation. In FIG. 1, the insulator 7 surrounds the probes 10. The insulator 7 is made of an insulating elastic body. The material of the insulator 7 is, for example, silicone rubber. In the case where the material of the insulator 7 is silicone rubber, a plurality of insulators 7 can be easily fabricated by molding, and therefore cost can be reduced. It should be noted that since the semiconductor device 5 may be evaluated at a high temperature of, for example, approximately 200° C., the insulator 7 is desirably made of a material which withstands use at such a temperature.

Figure 4:
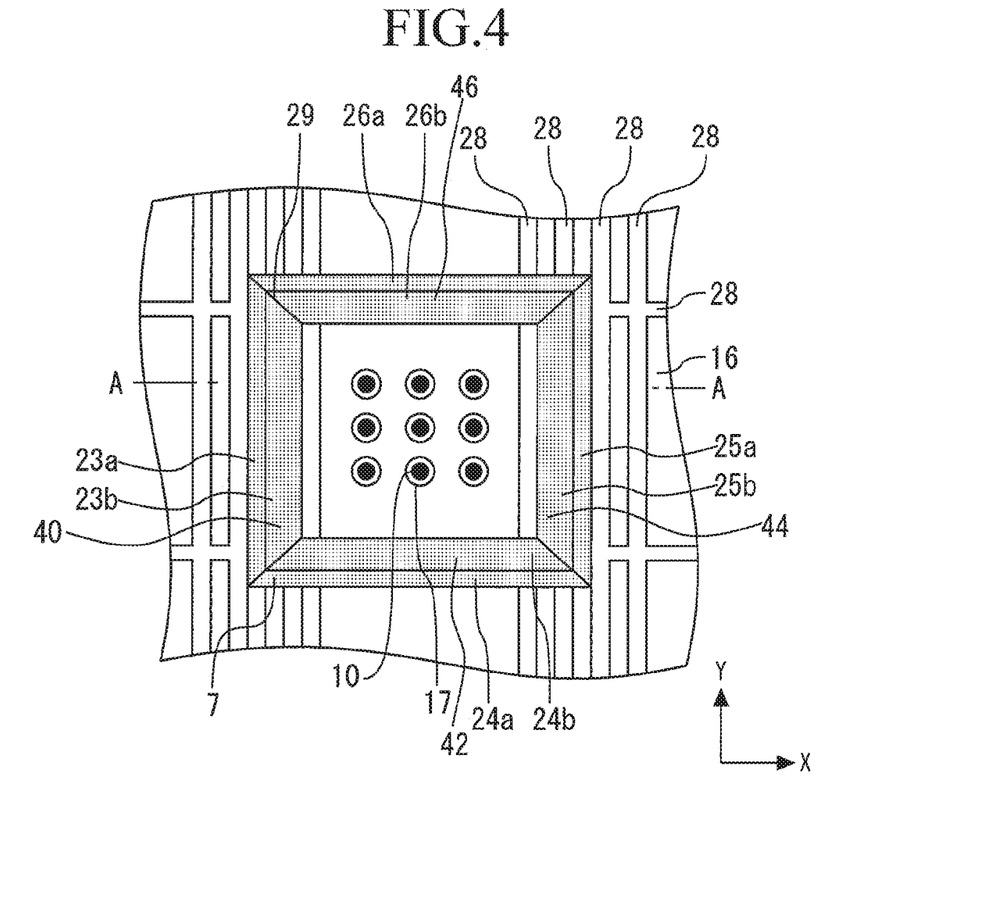
FIG. 4 is a bottom view showing the insulating plate, the insulator, and the probes.

FIG. 4 is a bottom view showing the insulating plate 16, the insulator 7, and the probes 10. The insulator 7 is made by combining a plurality of insulating portions 40, 42, 44, and 46. Of the insulating portions 40, 42, 44, and 46, two adjacent insulating portions make surface contact with each other to constitute one looped insulator 7. For example, the insulating portion 40 and the insulating portion 46 are in surface contact with each other without a clearance therebetween at an adjoining portion 29. Other two adjacent insulating portions are also in surface contact with each other at adjoining portions 29. The insulator 7 surrounds the probes 10 fixed to sockets 17. In the case where the outside shape of the semiconductor device 5 to be evaluated is a square, the four insulating portions 40, 42, 44, and 46 have equal lengthwise dimensions to constitute the insulator 7 having a square shape in planar view.

The insulating portion 40 has a lower surface 23a and a slope 23b. The insulating portion 42 has a lower surface 24a and a slope 24b. The insulating portion 44 has a lower surface 25a and a slope 25b. The insulating portion 46 has a lower surface 26a and a slope 26b, The lower surfaces 23a, 24a, 25a, and 26a are surfaces parallel to the xy plane. The slopes 23b, 24b, 25b, and 26b connect to the lower surfaces 23a, 24a, 25a, and 26a, respectively, and are slanted with respect to the xy plane.

A plurality of groove portions 28 are provided in the lower surface of the insulating plate 16. Each groove portion 28 linearly extends in the x or y direction. The insulator 7 fits into the groove portions 28 and is fixed to the insulating plate 16. In this case, there are groove portions 28 to which the insulator 7 is not fitted. Such groove portions are spare groove portions. The spare groove portions are provided to allow an insulator to be fitted thereto when the shape of an insulator is changed. Preferably, a plurality of spare groove portions are provided along each of the x and y directions.

Figure 5:
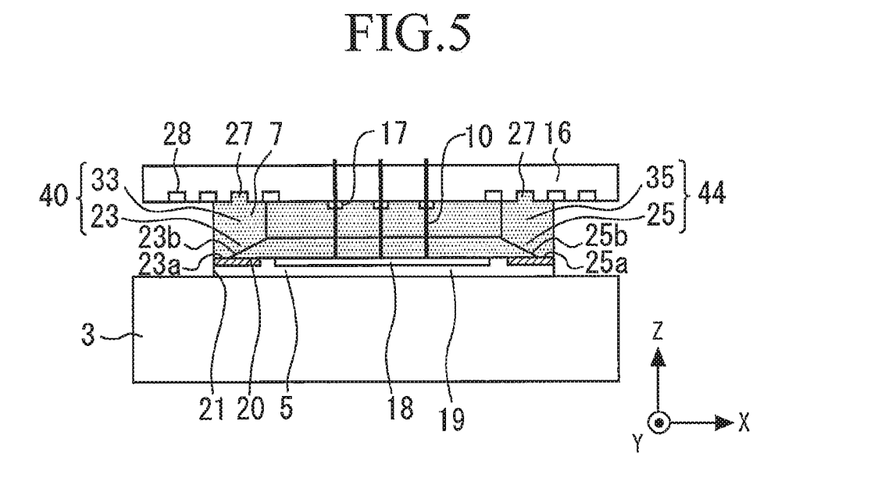
FIG. 5 is a cross-sectional view taken along line A-A in FIG. 4.

FIG. 5 is a cross-sectional view taken along line A-A in FIG. 4. FIG. 5 shows the semiconductor device 5 to be evaluated and also the chuck stage 3 thereunder. The sockets 17 are fixed to the insulating plate 16, and the probes 10 are respectively attached to the sockets 17. To evaluate electrical characteristics of the semiconductor device 5, the probes 10 are brought into contact with the electrode pad 18 provided in the active area 19 of the semiconductor device 5.

The insulating portion 40 includes a connection portion 33 and a tip portion 23. A fitting portion 27, which is a protrusion, is provided on an upper portion of the connection portion 33. The fitting portion 27 fits into the groove portion 28 of the insulating plate 16 to cause the insulating portion 40 to be fixed to the insulating plate 16. The fitting portion 27 can be removed from the groove portion 28 by pulling down the fitting portion 27. Thus, the connection portion 33 is connected to the insulating plate 16 in a detachable manner.

The tip portion 23 is a portion continuous with the connection portion 33, and the lower surface 23a thereof faces the surface of the chuck stage 3. The tip portion 23 has the slope 23b and is therefore narrower than the connection portion 33. The lower surface 23a of the tip portion 23 comes in contact with the termination region 20 of the semiconductor device 5. The length of the lower surface 23a in the x direction is shorter than the length of the termination region 20 in the x direction, and therefore the lower surface 23a comes in contact with part of the termination region 20 rather than the entire termination region 20.

The insulating portion 44 facing the insulating portion 40 across the probes 10 has a similar shape to that of the insulating portion 40, and a brief description thereof will be made. The insulating portion 44 includes a connection portion 35 and a tip portion 25. A fitting portion 27 on an upper portion of the connection portion 35 fits into the groove portion 28 to cause the insulating portion 44 to be fixed to the insulating plate 16. The fitting portion 27 can be removed from the groove portion 28 by pulling down the fitting portion 27. Thus, the connection portion 35 is connected to the insulating plate 16 in a detachable manner. The tip portion 25 is a portion continuous with the connection portion 35, and the lower surface 25a thereof faces the surface of the chuck stage 3. The tip portion 25 has the slope 25b and is therefore narrower than the connection portion 35. The lower surface 25a comes in contact with the termination region 20 of the semiconductor device 5. The length of the lower surface 25a in the x direction is shorter than the length of the termination region 20 in the x direction, and therefore the lower surface 25a comes in contact with part of the termination region 20 rather than the entire termination region 20.

The insulating portions 42 and 46 shown in FIG. 4, which also have similar shapes to those of the insulating portions 40 and 44, are fixed to the insulating plate 16 in the same manner as the insulating portions 40 and 44 and come in contact with part of the termination region 20 in the same manner as the insulating portions 40 and 44. Accordingly, the insulating portions 40, 42, 44, and 46 provide four connection portions and four tip portions. The four connection portions and the four tip portions surround the probes 10 in planar view.

Now referring to FIG. 5, a semiconductor device evaluation method according to the embodiment of the present invention will be described. In the case where a plurality of probes 10 are provided as in the present embodiment, first, the parallelisms of the contact portions 11 of the probes 10 are made equal before evaluation. Then, the semiconductor device 5 is fixed to the chuck stage 3 by vacuum suction. Subsequently, the probes 10 are brought into contact with the electrode pad 18. After, or at the same time as, the probes 10 and the electrode pad 18 come in contact with each other, the lower surfaces 23a, 24a, 25a, and 26a of the insulator 7 are pressed against part of the termination region 20 of the semiconductor device 5. At this time, the lower surfaces 23a, 24a, 25a, and 26a come in contact with an outer portion of the termination region 20. However, the lower surfaces 23a, 24a, 25a, and 26a do not come in contact with an inner portion of the termination region 20 where the slopes 23b, 24b, 25b, and 26b are located. It should be noted that die purpose of pressing the lower surfaces 23a, 24a, 25a, and 26a against part of the termination region 20 after, or at the same time as, the probes 10 and the electrode pad 18 come in contact with each other, is to reliably bring the probes 10 and the electrode pad 18 into contact with each other.

After that, electrical characteristics of the semiconductor device are evaluated. Specifically, the evaluation unit 4 passes currents through the probes 10 based on a predetermined recipe or the like and evaluates electrical characteristics of the semiconductor device 5 as an object to be measured. In the case where the chuck stage 3 is at a higher electric potential, the surface of the chuck stage 3 and a side surface 21 of the semiconductor device 5 are at the same higher electric potential. The electrode pad 18 is at a lower electric potential. Since the looped insulator 7 comes in contact with part of the termination region 20 of the semiconductor device 5, evaluation can be performed in a state in which the creepage distance between the electrode pad 18 on the upper surface of the semiconductor device 5 and a region having the same electric potential as the chuck stage 3 is increased. Accordingly, the occurrence of a partial discharge can be reduced during the evaluation of electrical characteristics of a semiconductor device.

To reduce partial discharges, the creepage distance needs to be increased. However, the insulator 7 does not have to be brought into contact with the entire surface of the termination region 20. An increase in the contact area between the insulator 7 and the termination region 20 may increase the number of foreign substances stuck therebetween or may cause a large rubber mark made by silicone rubber to be formed in the termination region 20. Stuck foreign substances and rubber mark formation may cause failures in a downstream process. Accordingly, in Embodiment 1 of the present invention, the tip of the insulator 7 is narrowed so that the insulator 7 may come in contact with only part of the termination region 20, and thus stuck foreign substances and rubber mark formation are reduced.

After evaluation, the insulator 7 and the probes 10 are immediately moved away from the upper surface of the semiconductor device 5 using the arm 9 to prevent a rubber mark from being transferred to the upper surface of the semiconductor device 5. Thus, bringing the insulator 7, together with the probes 10, into contact with the semiconductor device and reducing the contact area between the insulator 7 and the termination region 20 can reduce the occurrence of a partial discharge and reduce the transfer of a foreign substance or a rubber mark to the surface of the semiconductor device 5.

Moreover, since the insulator 7 is disposed to be capable of being detached from the insulating plate 16, the insulator 7 can be periodically changed before the insulator 7 becomes deteriorated. Further, when the shape of a termination region of a semiconductor device to be evaluated is changed, the insulator 7 can be detached from the insulating plate 16, and an insulator matching the shape of the termination region can be attached to the insulating plate 16.

Figure 6:
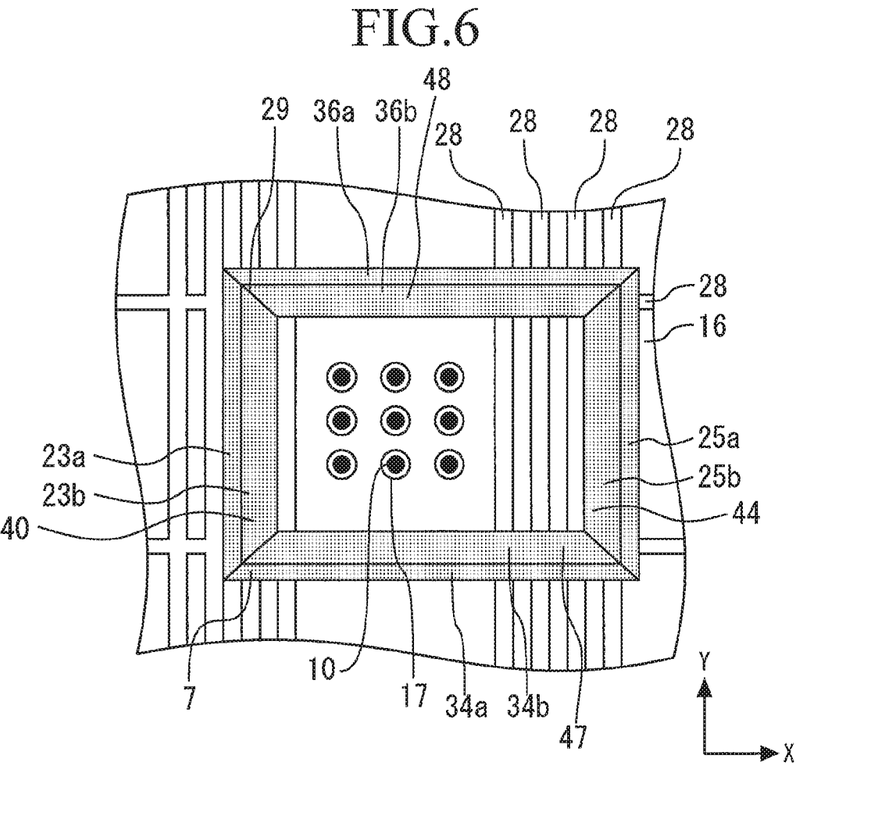

FIG. 6 is a bottom view showing an insulator 7 and the like used to evaluate a semiconductor device having a different termination region shape from that of FIG. 4. The insulator 7 in FIG. 4 includes four insulating portions 40, 42, 44, and 46, and the shape of the insulator 7 can be modified by modifying any of these insulating portions 40, 42, 44, and 46. FIG. 6 shows an insulator 7 in which insulating portions 47 and 48 replace the insulating portions 42 and 46 in FIG. 4. The insulating portions 47 and 48 are longer than the insulating portions 42 and 46 in FIG. 4, and therefore the insulator 7 in FIG. 6 is laterally long. The insulating portion 47 has a lower surface 34*a* and a slope 34*b*, and the insulating portion 48 has a lower surface 36*a* and a slope 36*b*. The lower surfaces 23*a*, 34*a*, 25*a*, and 36*a* form a looped lower surface.

The insulating portion 44 in FIG. 6 is fixed to a groove portion 28 located in the positive x direction from the groove portion 28 in FIG. 4 to which the insulating portion 44 is fixed. The lower surfaces 23*a*, 34*a*, 25*a*, and 36*a* in FIG. 6 form a rectangle as a whole in planar view. Accordingly, a semiconductor device having a rectangular outside shape and a termination region 20 formed along the outside shape can be evaluated. Thus, providing spare groove portions, which are a plurality of spare groove portions 28, in the lower surface of the insulating plate 16 enables the shape of the insulator 7 to be modified as desired. Thus, semiconductor devices 5 having various shapes can be evaluated only by changing all or part of the insulating portions. Accordingly, cost can be reduced. Of course, an insulator having a shape different from those of the insulators 7 shown FIGS. 4 and 6 may be prepared.

The probes 10 are fixed to the insulating plate 16 through the sockets 17, and the probes 10 can be easily attached and detached. Accordingly, for example, the number of probes 10 can be changed in accordance with the size of the semiconductor device 5, or a broken one of the probes 10 can be replaced.

In the evaluation apparatus and the semiconductor device evaluation method according to Embodiment 1 of the present invention, electrical characteristics of a semiconductor device are evaluated by passing currents through the probes 10 while the insulator 7 surrounding the probes 10 is placed in contact with part of the termination region 20 of the semiconductor device. The evaluation apparatus and the semiconductor device evaluation method of Embodiment 1 can be variously modified without departing from this feature. For example, while it has been described that the insulator 7 is configured by combining four linear insulating portions, the insulator 7 may include five or more linear or nonlinear insulating portions. Since the insulator 7 includes a plurality of insulating portions, the shape of the insulator 7 can be modified by replacing part of the insulating portions, or only a deteriorated one of the insulating portions can be replaced. Moreover, the area of a portion of the lower surface of the insulator 7 which comes in contact with the termination region of the semiconductor device may be reduced in a different way than providing slopes in tip portions of the insulating portions.

In Embodiment 1 of the present invention, the tip portions 23 and 25 are tapered by forming internal wall surfaces of the tip portions 23 and 25 as the slopes 23*b* and 25*b* as shown in FIG. 5. However, the tip portions may be narrowed in a different way. For example, the tip portions may be narrowed by forming both of the internal wall surface and the external wall surface of each tip portion as slopes. The degree to which the tip portions are narrowed is adjusted according to the width of the termination region of the semiconductor device.

When the semiconductor device 5 is evaluated, either the probes 10 or the chuck stage 3 may be at a higher electric potential. The way to apply voltage is determined according to an evaluation item. These modifications can be applied to evaluation apparatuses and semiconductor device evaluation methods according to embodiments below. It should be noted that the evaluation apparatuses and the semiconductor device evaluation methods according to the embodiments below have many things in common with those of Embodiment 1, and differences from Embodiment 1 will be mainly described.

Embodiment 2

Figure 7:
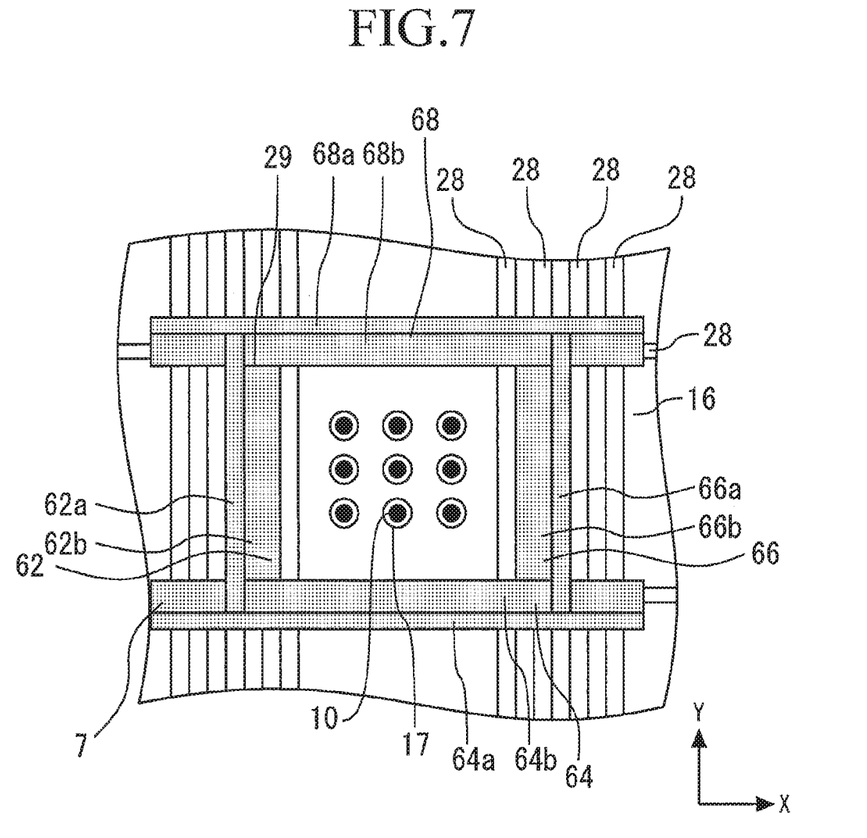
FIG. 7 is a bottom view showing an insulator and the like according to Embodiment 2.

FIG. 7 is a bottom view showing an insulator 7 and the like according to Embodiment 2. Insulating portions 64 and 68 are longer than insulating portions 62 and 66. Two opposite ends of each of the insulating portions 62 and 66 are in contact with longer side surfaces of the insulating portions 64 and 68. The insulating portion 62 has a lower surface 62a and a slope 62b, the insulating portion 64 has a lower surface 64a and a slope 64b, the insulating portion 66 has a lower surface 66a and a slope 66b, and the insulating portion 68 has a lower surface 68a and a slope 68b. With the slopes 62h, 64b, 66b, and 68b, the lower surfaces 62a, 64a, 66a, and 68a are narrow. It should be noted that each of the insulating portions 62, 64, 66, and 68 has a tip portion and a connection portion as in Embodiment 1, and the slopes 62h, 64h, 66b, and 68b and the lower surfaces 62a, 64a, 66a, and 68a belong to the tip portions.

When a semiconductor device is evaluated, the lower surfaces 62a and 66a, the lower surface 64a excluding both ends thereof, and the lower surface 68a excluding both ends thereof come in contact with part of the termination region 20 of the semiconductor device. If the long insulating portions 64 and 68 are prepared as shown in FIG. 7, the planar shape of the lower surface can be easily modified only by, for example, moving in the positive x direction the position at which the insulating portion 66 is attached to the insulating plate 16. This means that a change in the shape of the termination region which is caused by a change of an object to be measured can be easily dealt with. Thus, elongating insulating portions extending in one direction can reduce the number of types of insulating portions prepared in advance, and cost can be reduced.

Embodiment 3

Figure 8:
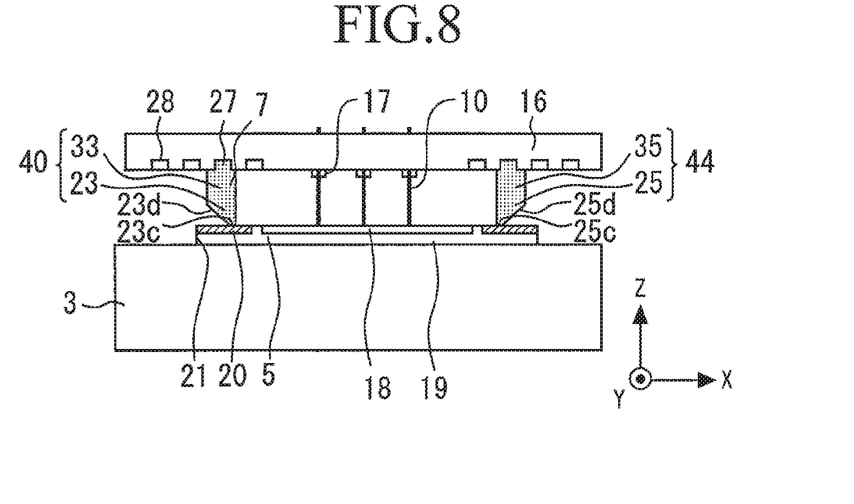
FIG. 8 is a cross-sectional view showing insulating portions and the like according to Embodiment 3.

FIG. 8 is a cross-sectional view showing insulating portions 40 and 44 and the like according to Embodiment 3. In the case where a high voltage is applied to the probes 10, the creepage distance is preferably increased near the probes 10 on a high-voltage side. Accordingly, in Embodiment 3, the tip portions 23 and 25 are formed in tapered shapes by forming the external wall surfaces of the tip portions 23 and 25 as the slopes 23d and 25d. Thus, the lower surfaces 23c and 25c can be located closer to the probes 10 than the lower surfaces 23a and 25a in FIG. 5 are. In this case, the lower surfaces of the insulating portions come in contact with a central portion of the termination region 20 rather than an outermost portion of the termination region 20.

The insulating portions 42 and 46 also have the same shapes as the insulating portions 40 and 44 of the present embodiment. This can reduce the contact area between the insulator 7 and the termination region 20 and improve the effect of reducing partial discharges.

Embodiment 4

Figure 9:
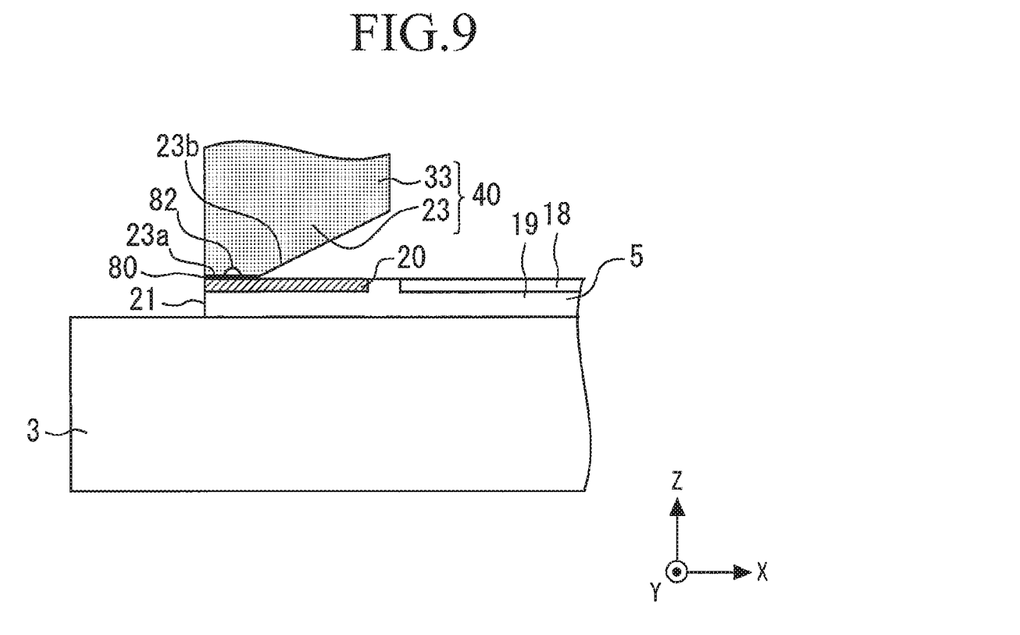
FIG. 9 is an enlarged view showing the insulating portion and the like according to Embodiment 4.

FIG. 9 is an enlarged view showing the insulating portion 40 and the like according to Embodiment 4. The insulating portion 40 which is part of the insulator 7 has a protective member 80 for protecting the lower surface 23a provided on the lower surface 23a of the tip portion 23 thereof. For the protective member 80, a material is employed which has durability against repeated contacts with the semiconductor device 5 and has good contact properties with the semiconductor device 5. Such a protective member 80 is, for example, a Teflon (registered trademark) coating.

Figure 10:
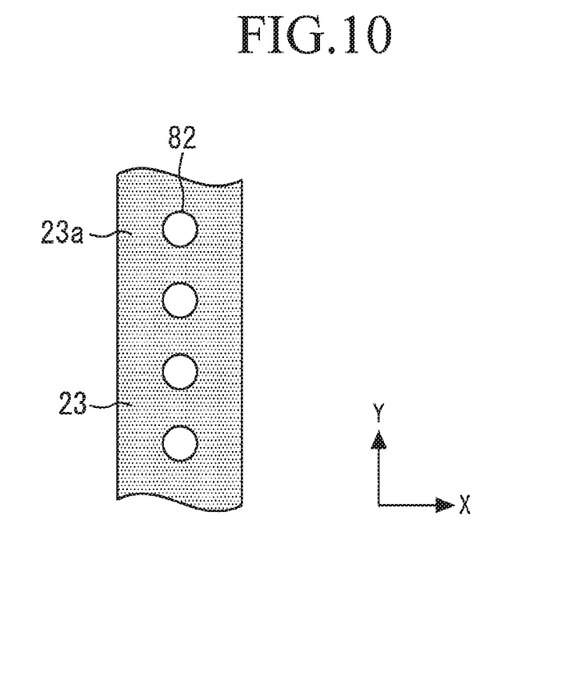
FIG. 10 is a bottom view of the tip portion.

Recessed portions 82 are formed in the lower surface 23a of the tip portion 23. FIG. 10 is a bottom view of the tip portion 23. A plurality of recessed portions 82 are formed in the lower surface 23a of the tip portion 23. Not only the tip portion 23, but the tip portion of each of all insulating portions constituting the insulator 7 has a plurality of recessed portions 82 provided in the lower surface thereof. Providing the plurality of recessed portions 82 can reduce the area over which the insulator 7 and the termination region 20 come in contact with each other with the protective member 80 interposed therebetween. Accordingly, the transfer of a foreign substance or a rubber mark to the surface of the semiconductor device 5 can be reduced.

To reduce the transfer of a foreign substance or a rubber mark to the surface of the semiconductor device 5, the length of the lower surface 23a in the x direction in FIGS. 9 and 10 should be made as small as possible. In other words, the tip portion 23 should be as narrow as possible. However, if the length of the lower surface 23a in the x direction in FIGS. 9 and 10 is excessively reduced, pressing the insulator 7 against the termination region 20 warps the insulator 7 and bends the tip portion 23, thus making difficult a stable contact between the tip portion 23 and the termination region 20. Accordingly, in Embodiment 4 of the present invention, the plurality of recessed portions 82 are provided in the lower surface 23a while the length of the lower surface 23a in the x direction is maintained. Thus, the tip portion 23 can be prevented from being bent while the contact area between the insulator 7 and the termination region 20 is reduced.

The arrangement of the recessed portions 82 can be appropriately modified. For example, recessed portions may be arranged in a staggered manner in planar view. Recessed portions arranged in a staggered manner can reduce the contact area between the insulator 7 and the termination region 20 while preventing the tip portion 23 from being bent when a semiconductor device is evaluated.

Embodiment 5

Figure 11:
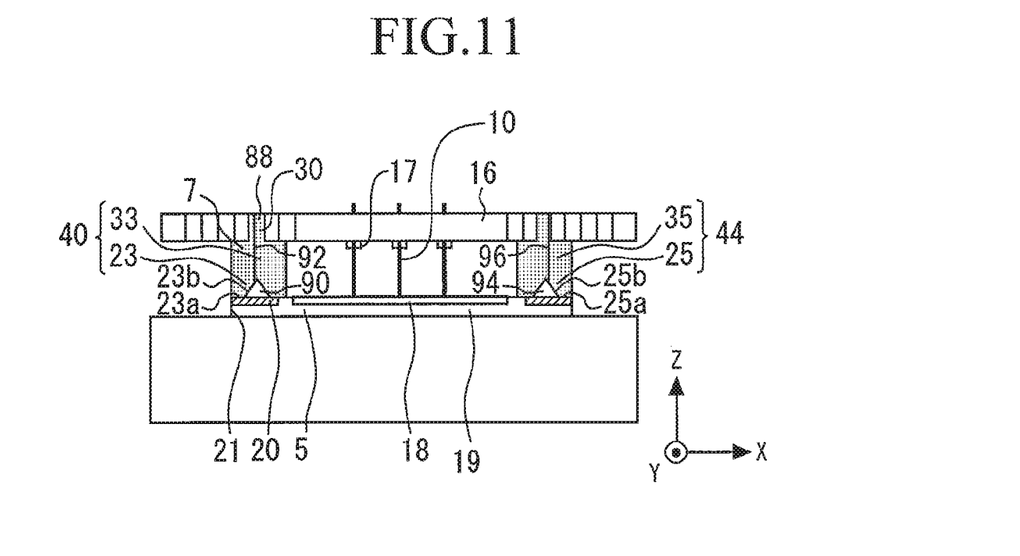
FIG. 11 is a view showing a semiconductor device evaluation method using an evaluation apparatus according to Embodiment 5.

FIG. 11 is a view showing a semiconductor device evaluation method using an evaluation apparatus according to Embodiment 5. The insulating portion 40 which is part of the insulator 7 has a groove 90 formed in the lower surface 23a of the tip portion 23 thereof, and the tip portion 23 has two lower surfaces 23a. In other words, since the groove 90 is provided, there are the lower surface 23a on the probe 10 side and the lower surface 23a which is farther from the probes 10 than the groove 90 is. The tip portion 25 has a groove 94 formed in the lower surface 25a thereof. Thus, the tip portion 25 has two lower surfaces 25a. In other words, since the groove 94 is provided, there are the lower surface 25a on the probe 10 side and the lower surface 25a which is farther from the probes 10 than the groove 94 is.

Figure 12:
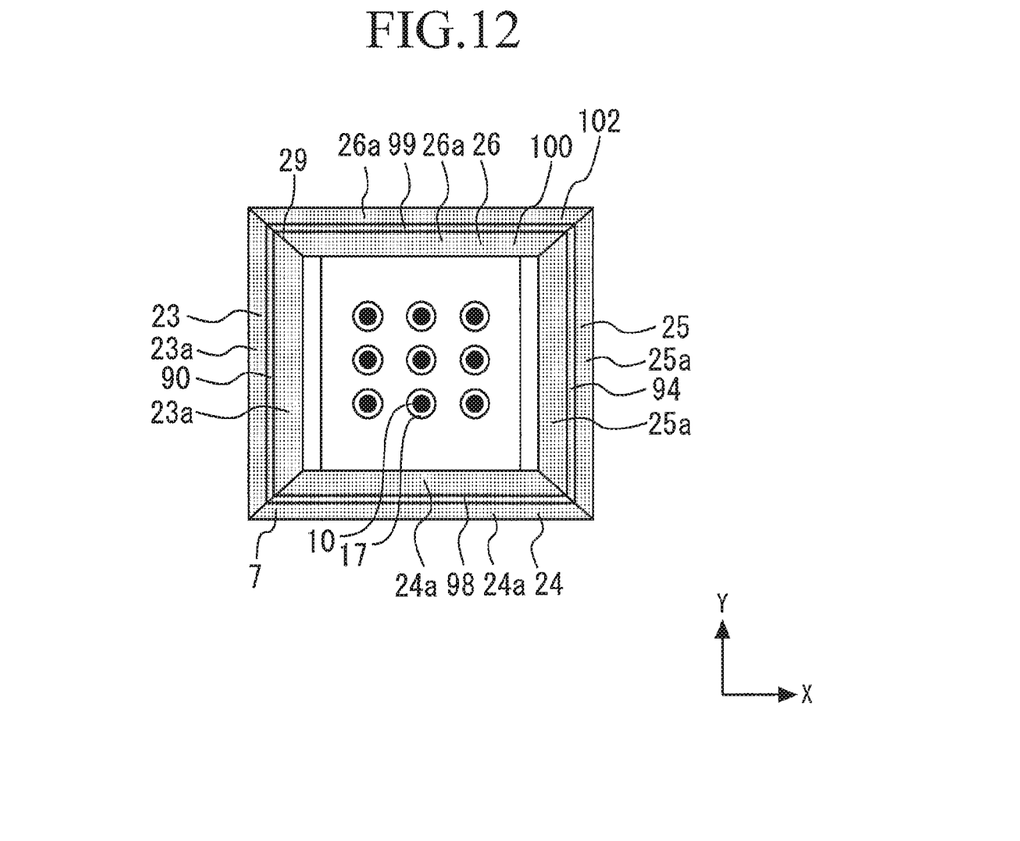
FIG. 12 is a bottom view of the insulator.

Not only the tip portions 23 and 25, but the tip portion of each of all insulating portions constituting the insulator 7 have a groove formed in a lower surface thereof. FIG. 12 is a bottom view of the insulator 7. A groove 98 is formed in the lower surface 24a of the tip portion 24, and the tip portion 24 has two lower surfaces 24a. A groove 99 is formed in the lower surface 26a of the tip portion 26, and the tip portion 26 has two lower surfaces 26a. Since the grooves 90, 98, 94, and 99 are respectively formed in the four tip portions 23, 24, 25, and 26, a groove having a looped shape in planar view is provided. As a result, the looped lower surface 100 which is closer to the probes 10 than the groove is and the looped lower surface 102 which is farther from the probes 10 than the groove is are provided.

When a semiconductor device is evaluated, the lower surface 100 and the lower surface 102 come in contact with the termination region 20 of the semiconductor device.

Bringing the lower surfaces into contact with two portions of the termination region 20 in this way can improve the effect of preventing the insulator 7 from being bent and warped. It should be noted that the number and shape of grooves may be modified as long as a tip portion has a plurality of lower surfaces.

Referring back to FIG. 11, a through-hole 30 is provided in the insulating plate 16. A protrusion 88 provided on the upper surface of the insulating portion 40 fits into the through-hole 30. Thus, the insulating portion 40 is fixed to the insulating plate 16. Other insulating portions 42, 44, and 46 are also fixed to the insulating plate 16 in the same way as the insulating portion 40. To detach the insulating portion 40 from the insulating plate 16, a downward force is applied to the protrusion 88 of the insulating portion 40 to remove the protrusion 88 from the through-hole 30.

Electromagnetic shields 92 and 96 are disposed inside the insulator 7. The electromagnetic shields 92 and 96 are provided to remove or reduce electromagnetic fields from the outside. The electromagnetic shields 92 and 96 are ferromagnetic members such as thin permalloy films. Electromagnetic shields can be easily provided inside the insulator 7 by integrally molding the electromagnetic shields 92 and 96 when the insulator 7 is fabricated. Preferably, every insulating portion has an electromagnetic shield provided therein so that electromagnetic shields may surround the probes 10. Electromagnetic shields may also be disposed on the surface of the insulator 7. During evaluation, electromagnetic shields reduce electromagnetic fields from the outside, and an electrical discharge or an evaluation accuracy deterioration caused by electromagnetic fields can be prevented.

Figure 13:
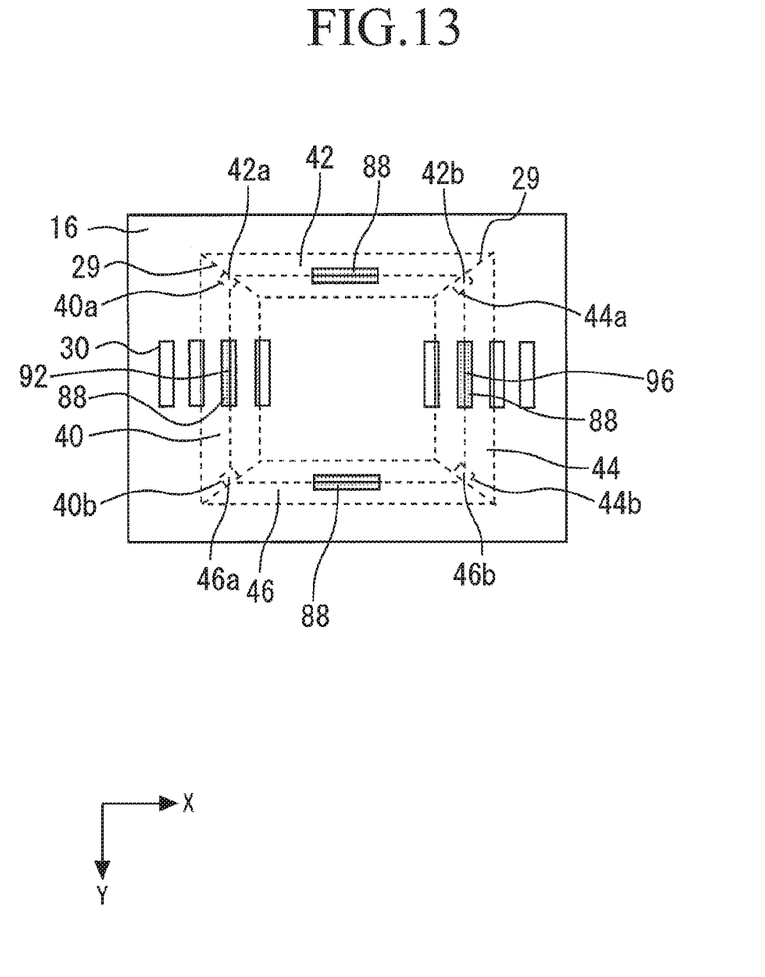
FIG. 13 is a plan view showing the insulating plate and the insulating portions fixed to the insulating plate.

FIG. 13 is a plan view showing the insulating plate 16 and the insulating portions 40, 42, 44, and 46 fixed to the insulating plate 16. Greater parts of the insulating portions 40, 42, 44, and 46 are located under the insulating plate 16, and the outlines of the insulating portions 40, 42, 44, and 46 are indicated by broken lines in FIG. 13. The insulating plate 16 has a plurality of through-holes 30 arranged in a non-looped shape in planar view. Specifically, each through-hole 30 is a linearly formed hole. Each of the insulating portions 40, 42, 44, and 46 has one protrusion 88 provided on the upper surface thereof, and these protrusions 88 fit into the through-holes 30. The protrusion 88 is formed along the longitudinal direction of the insulating portion and shorter than the insulating portion. If the through-hole 30 is long, the degree of freedom of electrical wiring layout on the insulating plate 16 is reduced accordingly. Thus, it is preferable that the area of the through-hole 30 is reduced.

Recessed portions 40*a* and 40*b* are provided in end portions of the insulating portion 40. Similarly, protruding portions 42*a* and 42*b* are provided in end portions of the insulating portion 42. Recessed portions 44*a* and 44*b* are provided in end portions of the insulating portion 44. Protruding portions 46*a* and 46*b* are provided in end portions of the insulating portion 46. The protruding portion 46*a* fits into the recessed portion 40*b* to make firm contact between the insulating portion 40 and the insulating portion 46 without a clearance. The protruding portion 42*a* fits into the recessed portion 40*a* to make firm contact between the insulating portion 40 and the insulating portion 42 without a clearance. The protruding portion 42*b* fits into the recessed portion 44*a* to make firm contact between the insulating portion 42 and the insulating portion 44 without a clearance. The protruding portion 46*b* fits into the recessed portion 44*b* to make firm contact between the insulating portion 46 and the insulating portion 44 without a clearance.

Thus, two insulating portions are brought into firm contact with each other without a clearance by fitting one of the insulating portions to the other insulating portion. Accordingly, when the insulator 7 is pressed against and brought into contact with the semiconductor device 5, clearances can be prevented from being generated in four adjoining portions 29.

To reduce partial discharges, increasing the creepage distance near the semiconductor device 5 is important. Accordingly, it is preferable that the recessed portion and the protruding portion are fitted to each other at a position in the adjoining portion 29 which is near the semiconductor device 5. This can reliably prevent a clearance between insulators from being generated near the semiconductor device 5. For example, the distance from the upper end of the insulating portion to the fitting position at which the recessed portion and the protruding portion fit to each other is made larger than the distance from the fitting position to the lower end of the insulating portion. It should be noted that a plurality of recessed portions and a plurality of protruding portions may be fitted to each other to make firm contact between two insulating portions.

Technical features described in Embodiments 1 to 5 may be combined.

In the present invention, a tip portion of an insulator is narrowed so that the insulator may be brought into contact with part of a termination region of a semiconductor device. Accordingly, when electrical characteristics of the semiconductor device are evaluated, the occurrence of a partial discharge can be reduced, and the transfer of a foreign substance or a rubber mark to the surface of the semiconductor device can also be reduced. Moreover, since a plurality of insulating portions constitute the insulator, convenience is unproved.

Obviously many modifications and variations of the present invention are possible in the light of the above teachings. It is therefore to be understood that within the scope of the appended claims the invention may be practiced otherwise than as specifically described.

What is claimed is:

1. An evaluation apparatus comprising:
an insulating plate;
a plurality of probes fixed to the insulating plate;
a plurality of insulating portions each having a connection portion connected to the insulating plate in a detachable manner and a tip portion continuous with the connection portion, the tip portions being narrower than the connection portions;
an insulator formed by combining the insulating portions to surround the plurality of probes in plan view; and
an evaluation unit for passing currents through the plurality of probes to evaluate electrical characteristics of an object to be measured.

2. The evaluation apparatus according to claim 1, further comprising:
a chuck stage, wherein
a lower surface of each tip portion faces a surface of the chuck stage.

3. The evaluation apparatus according to claim 1, wherein an internal wall surface of each tip portion is a slope, and each tip portion has a tapered shape.

4. The evaluation apparatus according to claim 1, wherein a groove is formed in a lower surface of each tip portion, and divides the lower surface into a plurality of lower surfaces.

5. The evaluation apparatus according to claim 1, wherein a lower surface of each tip portion is rectangular in plan view.

6. The evaluation apparatus according to claim 1, wherein an external wall surface of each tip portion is a slope, and the tip portion has a tapered shape.

7. The evaluation apparatus according to claim 1, wherein a recessed portion is formed in a lower surface of each tip portion.

8. The evaluation apparatus according to claim 1, wherein the insulator is made of silicone rubber.

9. The evaluation apparatus according to claim 1, further comprising:
a protective member provided on a lower surface of each tip portion to protect the lower surface.

10. The evaluation apparatus according to claim 1, wherein the insulator fits into a groove portion provided in a lower surface of the insulating plate.

11. The evaluation apparatus according to claim 10, wherein the insulating plate has a spare groove portion to which the insulator does not fit.

12. The evaluation apparatus according to claim 1, wherein the insulator fits into at least one through-hole provided in the insulating plate.

13. The evaluation apparatus according to claim 12, wherein the insulating plate has a through-hole to which the insulator does not fit.

14. The evaluation apparatus according to claim 12, wherein the at least one through-hole comprises a plurality of through-holes provided in a non-looped shape.

15. The evaluation apparatus according to claim 1, wherein two adjacent insulating portions of the plurality of insulating portions fit to each other.

16. The evaluation apparatus according to claim 1, further comprising:
a plurality of sockets fixed to the insulating plate, wherein the plurality of probes are fixed to the plurality of sockets.

17. The evaluation apparatus according to claim 1, further comprising:
an electromagnetic shield provided inside or on a surface of the insulator.

18. A semiconductor device evaluation method for evaluating electrical characteristics of a semiconductor device, comprising:
bringing a plurality of probes fixed to an insulating plate into contact with an active area of the semiconductor device;
bringing an insulator, which is comprised on a plurality of insulating portions each having a tip portion and a connection portion, and which is connected to the insulating plate in a detachable manner to surround the plurality of probes into contact with part of a termination region surrounding the active area of the semiconductor device directly or with a protective member interposed therebetween; and
passing currents through the plurality of probes.

* * * * *